United States Patent [19]
Sudo et al.

[11] Patent Number: 5,696,792
[45] Date of Patent: Dec. 9, 1997

[54] DIGITAL RADIOCOMMUNICATION TERMINAL

[75] Inventors: Shigeyuki Sudo, Fujisawa; Yasuaki Takahara, Yokohama; Katsumi Takeda, Yokohama; Jun Yamada, Yokohama, all of Japan

[73] Assignee: Hitachi, Ltd., Tokyo, Japan

[21] Appl. No.: 356,464

[22] Filed: Dec. 15, 1994

[30] Foreign Application Priority Data

Dec. 21, 1993 [JP] Japan .................. 5-322326

[51] Int. Cl.$^6$ .................. H04L 27/10; H04L 27/18
[52] U.S. Cl. .................. 375/279; 375/280; 375/332; 329/306; 329/307; 455/86; 455/315; 455/316
[58] Field of Search .................. 375/279, 280, 375/281, 329, 331, 332, 327; 329/304, 306, 307, 309, 310; 331/1 R, 30; 455/86, 314, 315, 316

[56] References Cited

U.S. PATENT DOCUMENTS 5,307,378  4/1994  Norimatsu .................. 455/86
5,388,125  2/1995  Toda et al. .................. 375/332
5,519,885  5/1996  Vaisamen .................. 455/86

FOREIGN PATENT DOCUMENTS 2-285571   9/1991  Japan .
2-259976  12/1992  Japan .

*Primary Examiner*—Stephen Chin
*Assistant Examiner*—Don Vo
*Attorney, Agent, or Firm*—Antonelli, Terry, Stout & Kraus, LLP

[57] ABSTRACT

The number of oscillators required to construct a digital radiocommunication terminal can be reduced and a circuit used for the digital radiocommunication terminal can be reduced in size. For this purpose, the digital radiocommunication terminal for effecting information transmission using an N (integer)-phase-shift-keyed signal (identification symbol number N=4 upon π/4 shifted QPSK modulation), is constructed such that an oscillation frequency generated from a reference oscillator employed with a frequency synthesizer is selected to have a common multiple of a second intermediate frequency and an identification symbol phase N and is supplied to a detector for outputting received data therefrom.

11 Claims, 8 Drawing Sheets

(○ IDEAL SYMBOL)

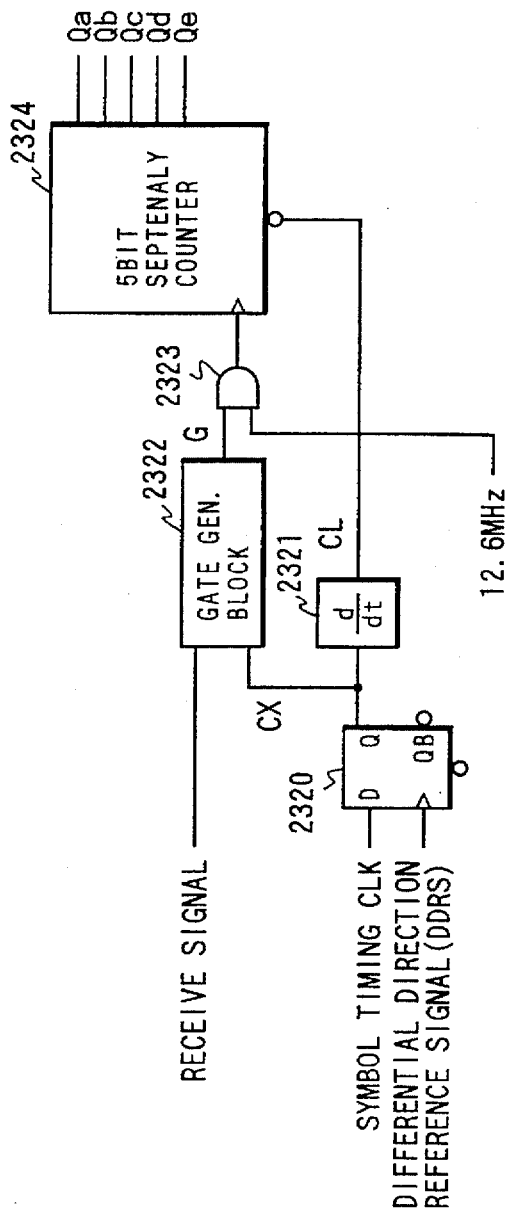
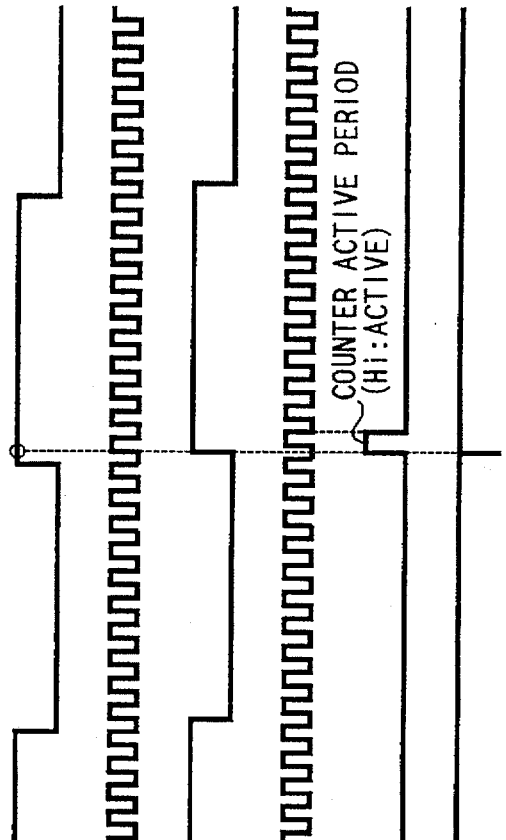
FIG. 5
FIG. 6A SYMBOL TIMING CLK
FIG. 6B DDRS
FIG. 6C CX
FIG. 6D RECEIVE SIGNAL
FIG. 6E G
FIG. 6F CL

IF A+B<7 THEN S=A+B ELSE S=A+B+1

DIGITAL RADIOCOMMUNICATION TERMINAL

BACKGROUND OF THE INVENTION

The present invention relates to a communication device for transmitting and receiving a signal which is phase-shift-keyed based on digital data, and particularly to a digital radiocommunication terminal which is suitable for use in a portable telephone or the like and whose size reduction is required.

FIG. 4 is a view showing an example of a conventional receiver employed in a digital radiocommunication terminal using a phase-shift-keyed signal. The receiver shown in FIG. 4 has a configuration in which a detector 2 is electrically connected to a superheterodyne receiver 1 having excellent spurious characteristics, such as an image or the like. A technique similar to this technique has been disclosed in Japanese Patent Application Laid-Open Publication No. 4-137921, for example.

Operations and characteristics of conventional receiver will be described below with reference to FIG. 4. A received signal having a radio frequency, which has been inputted to an input terminal 10, is frequency-converted by a first frequency converter 13 using an output produced from a frequency synthesizer 12 for multiplying an output generated from a reference oscillator 11 by a desired number. After the so-converted signal has been subjected to band restriction by a first IF filter 14, it is frequency-converted again by a second frequency converter 16 using an output produced from a second local oscillator 15 and is subjected to a band restriction by a second IF filter 17. Further, the signal received in the second intermediate frequency band is amplified and amplitude-restricted by a limiter amplifier 18, after which the so-processed signal is inputted to the detector 2 as an output to be generated from the superheterodyne receiver 1.

The detector 2 serves as a digital demodulator of a type wherein an output produced from a fixed-frequency oscillator 21 is used as an operating clock. Further, the detector 2 detects a phase angle of a phase-shift-keyed signal and decodes the received data in accordance with a predetermined coding rule. As a known technique of the detector 2, there is a circuit described in Japanese Patent Application Laid-Open Publication No. 3-205940, which provides an easy LSI and is suited for a size reduction of the receiver. A detailed description of the circuit using drawings will be omitted herein. However, the present circuit is provided with a reference signal generating means for generating a predetermined reference signal corresponding to a modulated signal received from the output of the fixed-frequency oscillator 21 and is constructed so as to detect the modulated signal based on the reference signal.

Size reduction in a digital radiocommunication terminal or a portable telephone terminal, has been a design requirement in recent years. It has also been desired to reduce the number of parts which form such a terminal. From this point of view, it will be noted that the aforementioned prior art needs three oscillators, i.e., the reference oscillator 11, the second local oscillator 15 and the fixed-frequency oscillator 21. Further, the prior art is accompanied by a problem that, since a plurality of separated oscillators are disposed within a small-sized housing close to each other, beat noise tends to be produced.

SUMMARY OF THE INVENTION

The present invention has for its object to provide a digital radiocommunication terminal which reduces the number of oscillators to a desired number and is therefore suitable for an overall size reduction of the terminal.

According to one aspect Of the present invention, for achieving the above object, there is provided a digital radiocommunication terminal for effecting information transmission using an N-phase-shift-keyed signal by N-symbols (where N: integer), comprising:

reference frequency oscillation means;

frequency synthesize means for multiplying an oscillation output generated from the reference frequency oscillation means by a predetermined number;

first frequency converting means for generating a first intermediate-frequency band signal from an oscillation output generated from the frequency synthesize means and a received signal;

first intermediate frequency filtering means for effecting a band restriction on an output produced from the first frequency converting means;

second local oscillation means;

second frequency converting means for generating a second intermediate-frequency band signal from an output produced from the second local oscillation means and an output produced from the first intermediate frequency filtering means;

amplifying means for amplifying the second intermediate-frequency band signal; and detecting means for detecting a modulated phase angle from a signal outputted from the amplifying means;

the oscillation output frequency generated from the reference frequency oscillation means being set to a common multiple of the N symbols and the second intermediate frequency.

The detecting means detects the modulated phase angle from the received signal amplified by the amplifying means after having been frequency-converted into the second intermediate frequency band signal. At this time, the detecting means detects the phase of the received signal at a phase resolution of an integral multiple of N to identify N kinds of modulation symbols.

Thus, an operating clock used for the detecting means needs to have a frequency which is N times or more greater than the second intermediate frequency. The oscillation output of the reference frequency oscillation means, which has been selected to be a common multiple of both the N symbols and the second intermediate frequency, can be used as the operating clock.

The above and other objects, features and advantages of the present invention will become apparent from the following description and the appended claims, taken in conjunction with the accompanying drawings in which a preferred embodiment of the present invention is shown by way of illustrative example.

BRIEF DESCRIPTION OF THE DRAWINGS

FIG. 5 is a schematic circuit diagram showing an internal configuration of the phase-lag detector shown in FIG. 2;

FIG. 6 is a timing chart for describing the operation of the phase-lag detector shown in FIG. 2;

DETAILED DESCRIPTION OF THE PREFERRED EMBODIMENTS

A preferred embodiment of the present invention will hereinafter be described with reference to the accompanying drawings.

Figure 1:
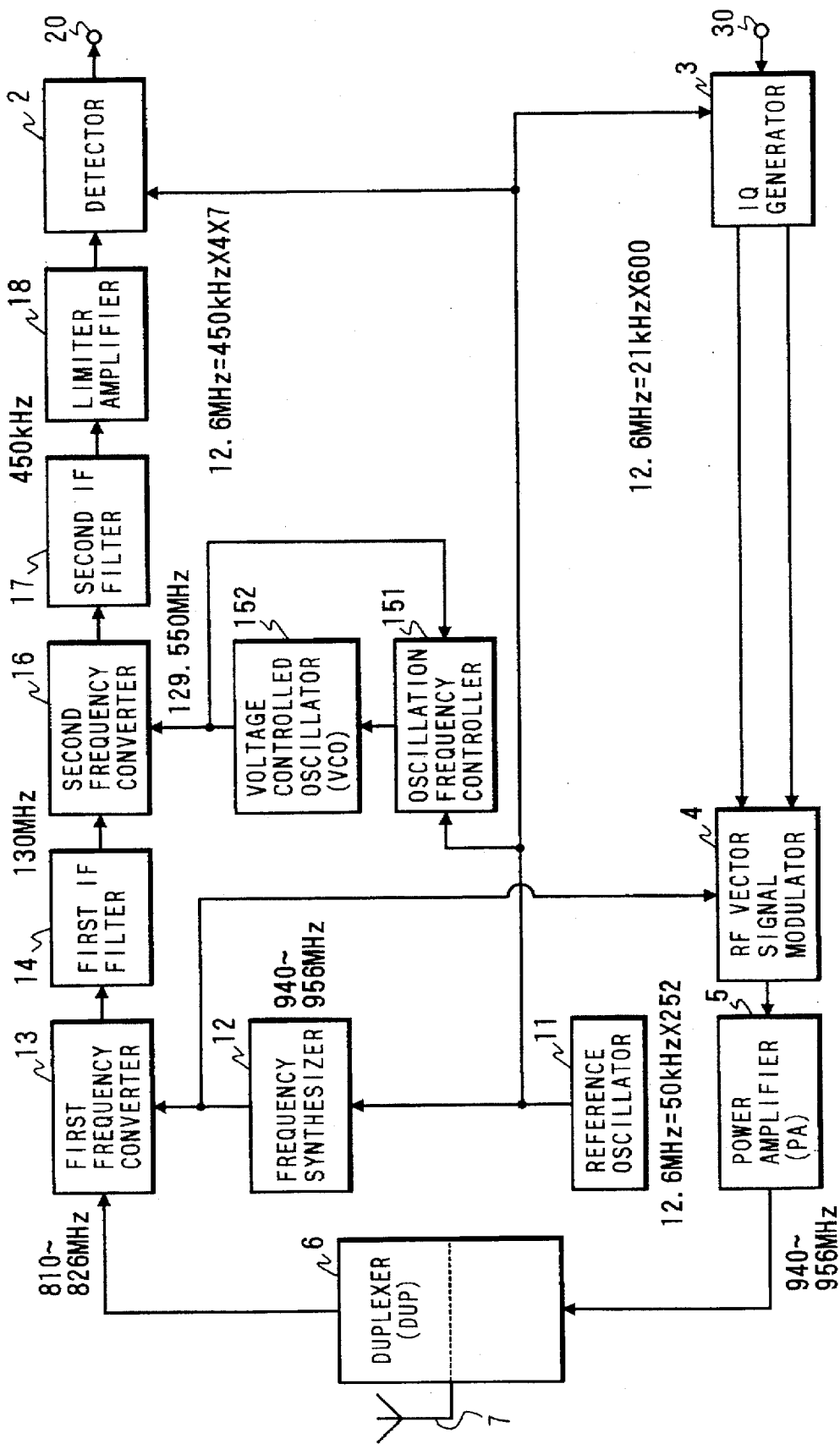
FIG. 1 is a block diagram showing the structure of a digital radiocommunication terminal according to one embodiment of the present invention.

FIG. 1 is a block diagram showing the structure of a digital radiocommunication terminal according to one embodiment of the present invention. In FIG. 1, the terminal includes a detector 2, an I/Q generator 3, a radio frequency vector signal modulator 4, a power amplifier 5, a duplexer 6, an antenna 7, a reference oscillator 11, a frequency synthesizer 12, a first frequency converter 13, a first IF filter 14, an oscillation frequency controller 151, a voltage-controlled oscillator 152, a second frequency converter 16, a second IF filter 17, a limiter amplifier 18, a receive data output terminal 20 and a transmit data input terminal 30.

The present embodiment shows one example of the configuration of the digital radiocommunication terminal employed in a digital cellular telecommunication system (RCR STD-27B, Research & Development Center for Radio System) using a mobile station receive frequency range of 810 MHz to 826 MHz and a mobile station transmit frequency range of 940 MHz to 956 MHz.

A π/4 shifted QPSK modulation signal of 42 kbps (21 kbaud) is used for the information transmission. The radio channel width is 50 kHz (25 kHz interleaved).

The operation of the digital radiocommunication terminal will be described below.

A signal having a given radio frequency, which is received by the antenna 7, is inputted to the first frequency converter 13 via the duplexer 6. Further, an oscillation output generated from the frequency synthesizer 12 using an output of 12.6 MHz generated from the reference oscillator 11, is supplied to the first frequency converter 13. When the frequency of the received signal is of 820 MHz, for example, the frequency synthesizer 12 outputs 950 MHz therefrom. Namely, a first intermediate frequency is set to 130 MHz. Since an interval between transmit and receive frequencies is set to 130 MHz in the digital cellular telecommunication system, the output of the frequency synthesizer 12 can be used as the transmit frequency as it is. Since the radio channel width is 50 kHz, the reference oscillator 11 needs an integral multiple of 50 kHz. In the present embodiment, 12.6 MHz is used as the channel width.

Now, the output of the first frequency converter 13 is filtered by the first IF filter 14 and is inputted to the second frequency converter 16. A device such as a SAW filter or the like is used as the first IF filter 14.

In response to 129.550 MHz outputted from the voltage-controlled oscillator 152, the second frequency converter 16 converts the received signal into a signal in a second intermediate frequency band, which has been selected as 450 kHz. Thus, 129.550 MHz is outputted from the Voltage controlled oscillator 152 by controlling the voltage controlled oscillator 152 so as to be synchronized with the reference oscillator 11 using the oscillation frequency controller 151. The output of the second frequency converter 16 serves so as to effect a band restriction for causing only a desired wave to pass through the second IF filter 17, i.e., a root-Nyquist-roll-off filtering using a ceramic filter in the present embodiment, for example. This filtered signal is amplified and amplitude-restricted by the limiter amplifier 18. Thereafter, the so-processed signal is outputted to the detector 2 as a received signal having a rectangular waveform. Thus, a phase shift angle based on the π/4 shifted QPSK signal can be detected from either an edge of a signal having the rectangular waveform or a zero-crossing phase.

The detector 2 makes use of the oscillation output of 12.6 MHz generated from the reference oscillator 11 to detect the phase of the received signal. Therefore, the frequency of 12.6 MHz was selected as a common multiple of 4 corresponding to the number of symbol phases of the second intermediate frequency 450 kHz and the π/4 shifted QPSK signal (i.e., 12.6 MHz=450 kHz×4×7).

This point will now be described together with the structure of the detector 2.

Figure 2:
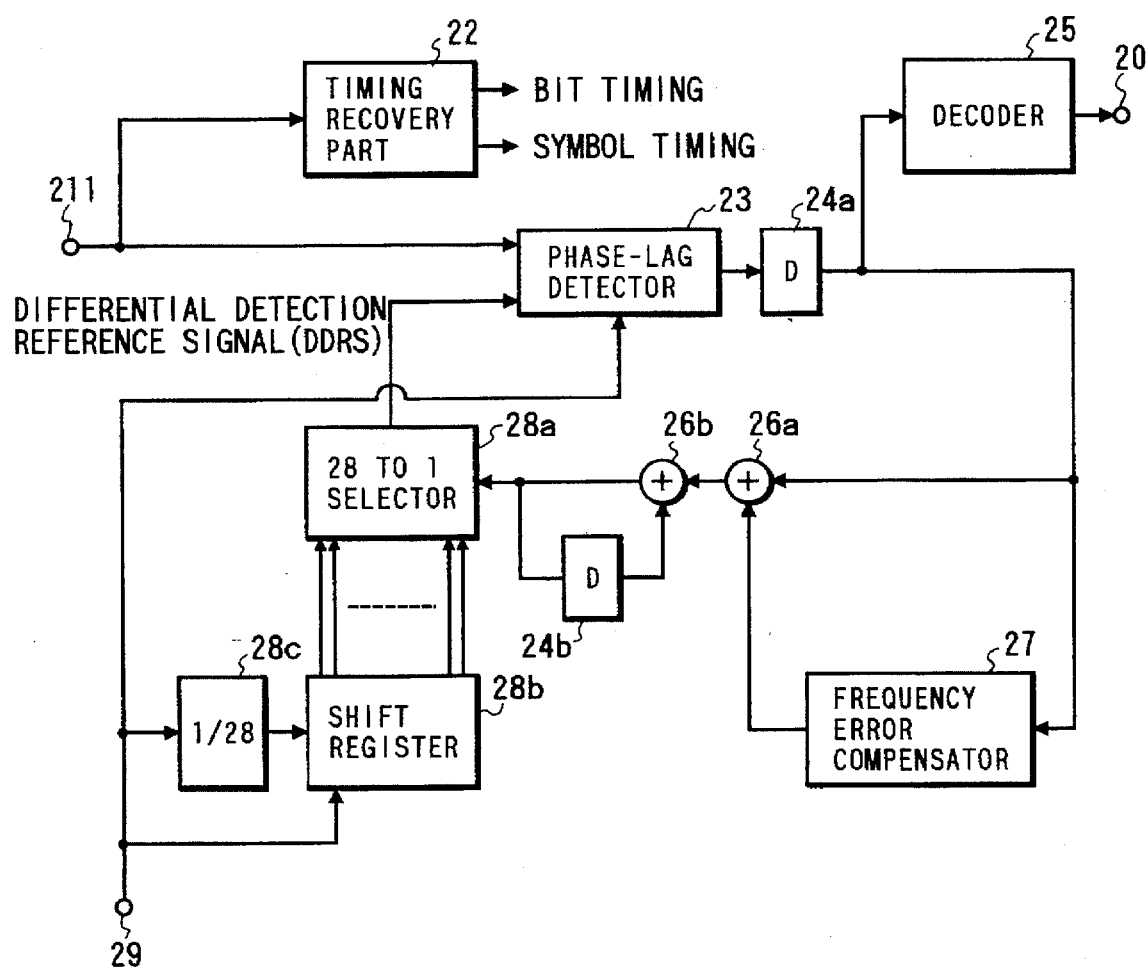
FIG. 2 is a block diagram showing one example of the structure of the detector shown in FIG. 1.

FIG. 2 is a view showing the structure of the detector 2. In FIG. 2, it is seen that the detector includes a receive signal input terminal 211, a timing recovery part 22, a phase-lag detector 23, delay latches 24a and 24b, a decoder 25, adders 26b, a frequency error compensator 27, a data selector 28a, a shift register 28b, a 1/28 divider 28c, and a terminal for inputting an output (12.6 MHz) generated from the reference oscillator 11.

The detector 2 detects a phase difference or lag between an output (hereinafter called a "differential detection reference signal (DDRS)") produced from the data selector 28a and the receive signal, for each symbol timing outputted from the timing recovery part 22. Further, the decoder 25 identifies the detected data and converts it into receive data to be outputted therefrom.

To basically activate the detector 2 as a delay detector, the phase-lag detector 23 is constructed so that the phase of the DDRS is locked with the phase of a receive signal prior to one symbol. This process will now be described below.

The 1/28 divider 28c first generates a signal of 450 kHz in response to 12.6 MHz inputted from the input terminal 29 and inputs the generated signal to the shift register 28b. The shift register 28b serves as a 28-stage shift register. The shift register 28b shifts the signal of 450 kHz using 12.6 MHz and outputs one period of the signal of 450 kHz to the data selector 28a as 28 multiphase signals different in phase from each other at 2π/28 [rad] intervals. In accordance with the select control inputs, the data selector 28a outputs a signal of 450 kHz having a desired phase, from the multiphase signals, to the phase-lag detector 23 as the DDRS.

Figure 3:
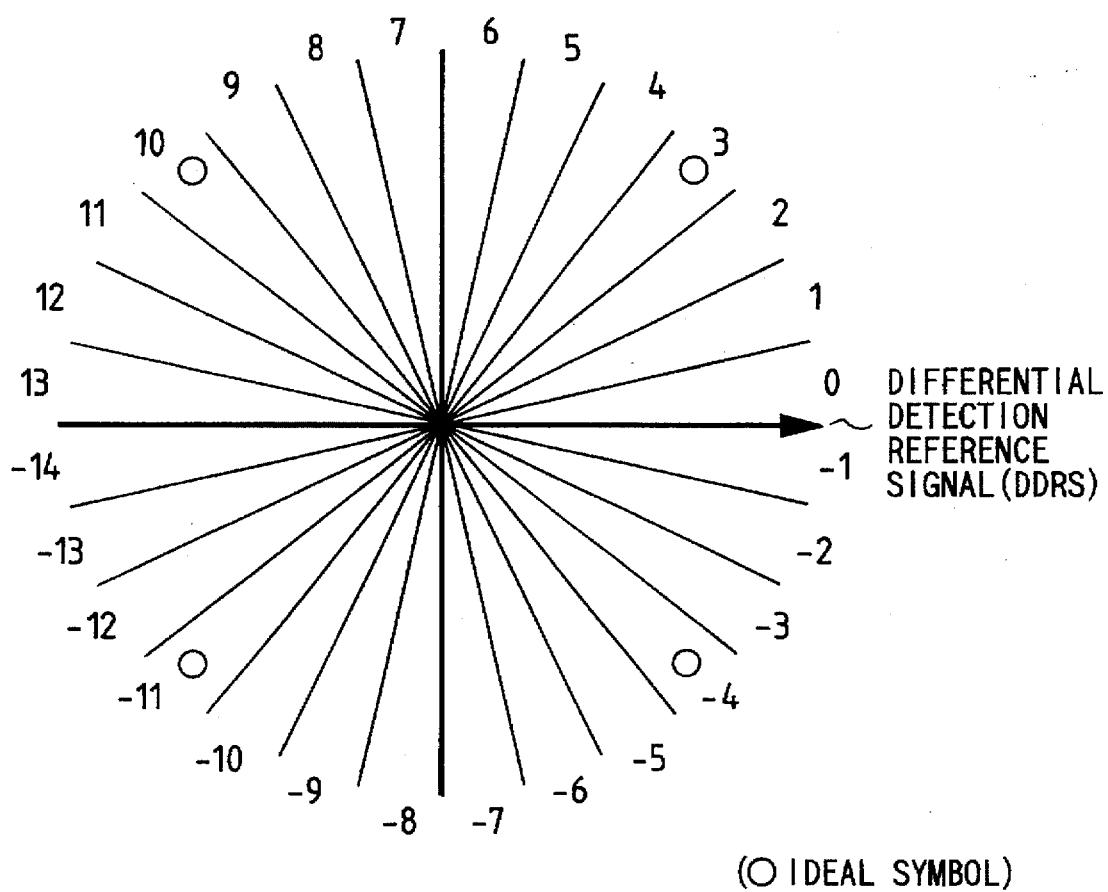
FIG. 3 is a diagram for describing the operation of the phase-lag detector shown in FIG. 2.
Figure 4:
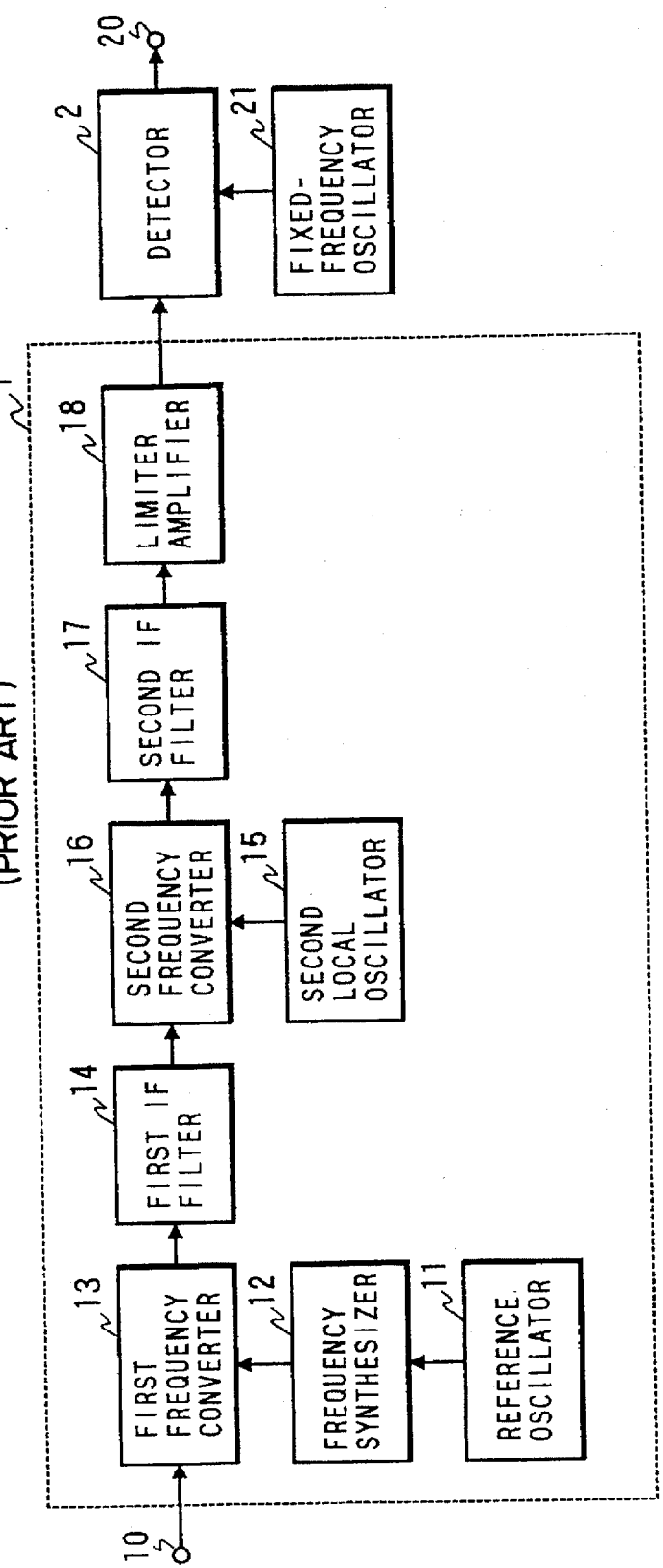
FIG. 4 is a block diagram illustrating the structure of an example of a conventional receiver employed in a digital radiocommunication terminal.

Next, the phase-lag detector 23 detects a phase difference or lag between a received signal inputted to the terminal 211 and the DDRS. FIG. 3 is a view for describing the operation of the phase-lag detector 23 and illustrates a phase space divided into 2π/28 [rad] intervals in which reference is made by 0 to 13 along a phase-lag direction and −1 to −14 along a phase-lead direction with the DDRS as a reference.

The π/4 shifted QPSK modulation employed in the present embodiment is based on a system for carrying information on phase shift angles during a symbol duration, which performs (π/4 [rad], 3π/4 [rad], −π/4 [rad] and −3π/4 [rad]) coding on two-bit information (00, 01, 10, 11) respectively. A point indicated by each circle(○)in FIG. 3 shows an ideal symbol phase when a phase placed previously by one symbol is of the DDRS. It is necessary for the detector 2 to identify such four kinds of symbols.

If a gate pulse corresponding to the phase lag between the DDRS and the received signal is generated and the width of the generated gate pulse is counted as 12.6 MHz, as referred to above, then a phase to be received can be detected with a precision of 1/28 dividing the phase space. The result of detection is decoded into an information bit corresponding to 2 bits by the decoder 25 and is outputted from the output terminal 20 as receive data.

The common multiple of the symbol number corresponding to 4 and the second intermediate frequency of 450 kHz has originally been used as a condition for the clock to be counted here. It is, however, necessary to select a range in which quantum noise of the phase does not degrade demodulation characteristics of the detector 2.

The frequency of 12.6 MHz as employed in the present embodiment can quantize the receive phase into 5 bits. However, 5 bits represented in binary form take 32 different values. In the present embodiment, the 28 values shown in FIG. 3 are associated with bit strings represented in Table 1 shown below. Therefore, when it is desired to perform the above counting process and an adding process to be described later, a septenary logic process is required.

TABLE 1

| phase index | phase-lag quantize value | BS Tx data** |
|---|---|---|
| 0 | 0 0 0 0 0 | |
| 1 | 0 0 0 0 1 | |
| 2 | 0 0 0 1 0 | |
| 3 | 0 0 0 1 1 | 10 |
| 4 | 0 0 1 0 0 | |
| 5 | 0 0 1 0 1 | |
| 6 | 0 0 1 1 0 | |
| 7 | 0 1 0 0 0 | |
| 8 | 0 1 0 0 1 | |
| 9 | 0 1 0 1 0 | |
| 10 | 0 1 0 1 1 | 11 |
| 11 | 0 1 1 0 0 | |
| 12 | 0 1 1 0 1 | |
| 13 | 0 1 1 1 0 | |
| −14 | 1 0 0 0 0 | 00 |
| −13 | 1 0 0 0 1 | |
| −12 | 1 0 0 1 0 | |
| −11 | 1 0 0 1 1 | |
| −10 | 1 0 1 0 0 | |
| −9 | 1 0 1 0 1 | |
| −8 | 1 0 1 1 0 | |
| −7 | 1 1 0 0 0 | |
| −6 | 1 1 0 0 1 | |
| −5 | 1 1 0 1 0 | |
| −4 | 1 1 0 1 1 | 01 |
| −3 | 1 1 1 0 0 | |
| −2 | 1 1 1 0 1 | |
| −1 | 1 1 1 1 0 | |

** mobile receiver
1st local frequency>receive ch frequency
2nd local frequency<2nd IF frequency The value of the receive phase, which is detected for each symbol, is retained in the delay latch 24a. Therefore, a necessary symbol timing signal is supplied from the timing recovery part 22.

The output of the delay latch 24a is supplied to the data selector 28a through the adders 26a and 26b as a select control input so that a differential detection operation is performed.

The septenary counting process of the phase-lag detector 23 will now be described. FIG. 5 is a circuit diagram showing an internal configuration of the phase-lag detector 23 for performing quantization corresponding to Table 1. FIG. 6 is a timing chart for describing the operation of the phase-lag detector 23.

In FIG. 5, the detector is seen to include a D flip-flop 2320, a leading edge extraction part 2321, a gate pulse generator block 2322, an AND gate 2323 and a counter 2324 for performing a septenary counting operation.

Further, a latch output Q of the D flip-flop 2320, a signal outputted from the leading edge extraction part 2321 and a gate signal outputted from the gate pulse generator block 2322 are referred to using the signal names CX, CL and G, respectively.

Since the symbol rate is 21 kHz and the second IF frequency is 450 kHz in the present embodiment, 21 waves or so are inputted per symbol on an average basis. It is, however, unnecessary to detect all the phase lags between edges of the inputs. A phase lag produced immediately after the symbol timing may simply be detected. Thus, a quantizing operation is performed once per symbol and counting operations to be executed for other durations are stopped. Further, power consumption in the circuit is reduced.

The D flip-flop 2320 latches the symbol timing (leading-edge timing) as shown in FIG. 6 with a DDRS signal regarded as the clock and generates a CX signal having one-symbol lag phase information included therein.

Next, the gate pulse generator block 2322 outputs the gate signal G having a pulse width from the time when the CX signal rises to the time when the received signal rises.

Further, the gate signal G and the clock signal of 12.6 MHz are supplied to two inputs of the AND gate 2323 and the output of the AND gate 2323 is connected to a clock of the counter 2324.

As a result, the counting clock is supplied to the counter 2324 only when the signal G at a "Hi" level.

However, when the counter 2324 starts its counting operation, it detects the leading edge of the CX signal and is initialized based on the generated negative pulse signal CL.

Thus, each of 5 bit outputs from Qa to Qe of the counter 2324 becomes an output obtained by detecting a phase lag between the DDRS signal and the received signal with the DDRS signal as a reference. The counting operation is carried out such that "111" does not appear in the bit string of the three rightmost bits, thereby leading to a septenary operation which divides one quadrant of the phase space into quantization steps corresponding to seven stages.

Figure 7:
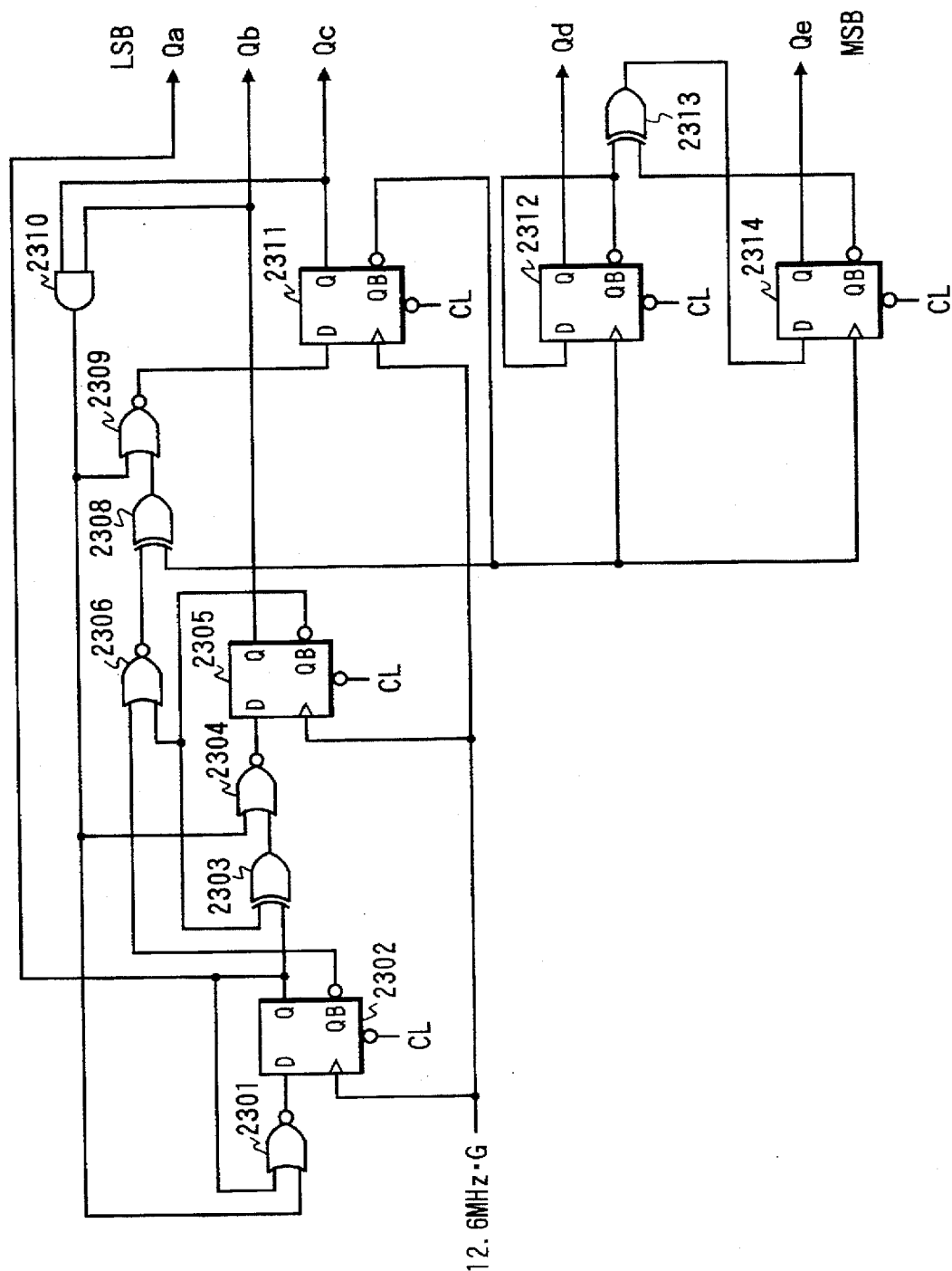
FIG. 7 is a schematic circuit diagram illustrating an internal configuration of the counter 2324 shown in FIG. 5.

A circuit diagram of the inside of the counter 2324 for effecting this operation will be shown in FIG. 7. In FIG. 7, reference numerals 2301, 2304, 2306 and 2309 indicate NOR gates. Designated at numerals 2302, 2305, 2311, 2312 and 2314 are D flip-flops. Further, reference numerals 2303, 2308 and 2313 indicate exclusive OR gates and reference numeral 2310 indicates an AND gate.

Receive data to be decoded is associated with respective data of 5 bits from Qa to Qe obtained under the structure shown in FIG. 7, like the BS Tx data shown in Table 1.

The reason for this association is as follows:

A mixed frequency higher than a receive frequency was used in a first frequency converter employed in the present embodiment. At this time, lead and lag directions of phase modulation on the transmitting side are reversed in the case of a first IF signal. Since a second local oscillation frequency is set so as to become lower than the first intermediate frequency, the mixed frequency is retained as a second IF frequency while the lead and lag directions remain reversed.

As a result, the lead and lag of the phase modulation transmitted are detected as being directed in the reverse directions in the case of the data Qa to Qe counted by the counter 2324.

The above setting of the mixed frequency is intended to reduce a frequency drift included in the second IF signal. A frequency error of the first IF signal, which is caused by a frequency error included in the frequency synthesizer 12 and a frequency error of the second IF signal, which is caused by a frequency error included in the second local oscillation frequency, are proportional to a frequency error of the reference oscillator 11 shown in FIG. 1 and are different in positive and negative sign from each other.

If it is desired to ensure that occurs between the detected values of the counted data and the lag and lead directions of the phase modulation on the transmitting side, the second local oscillation frequency may be set to 130.450 MHz as an alternative to 129.55 MHz. In this case, the two leftmost bits of Qe and Qd are used as received data as they are.

Next, each of the adders 26a and 26b needs to be one other than a binary 5-bit adder and needs to be constructed in such a way as to obtain output values restricted to 28-step values ranging from 13 to −14, as shown in FIG. 3 and Table 1.

Figure 8:
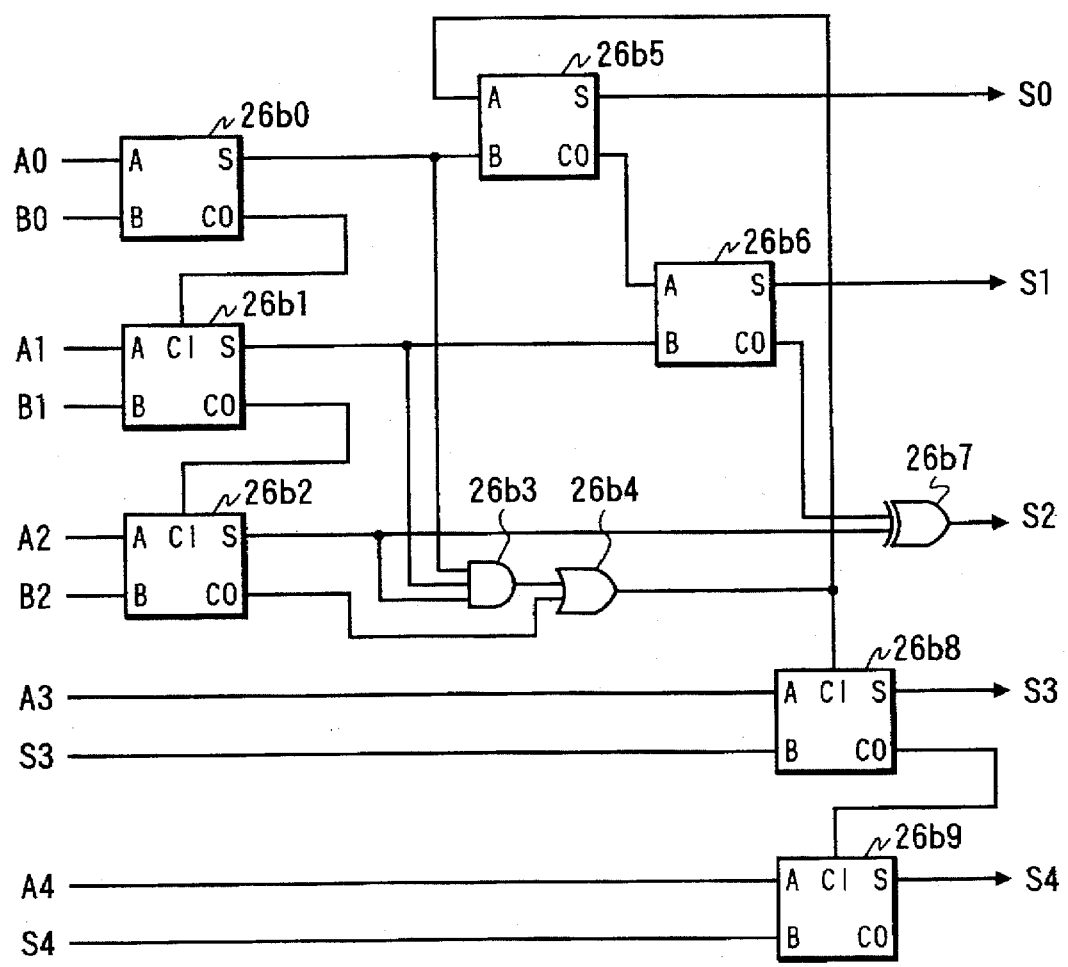
FIG. 8 is a schematic circuit diagram depicting an internal configuration of the adder 26b shown in FIG. 2.

FIG. 8 is a circuit diagram showing an internal configuration of the adder 26b for effecting a septenary addition. In FIG. 8, reference numerals 26b0, 26b5 and 26b6 indicate half adders. Reference numerals 26b1, 26b2, 26b8 and 26b9 indicate full adders. Reference numerals 26b3, 26b4 and 26b7 indicate a three input AND gate, an OR gate and an exclusive OR gate, respectively.

Further, symbols CI, CO, S and AB of the individual adders indicate a carrier input, a carrier output, an add output, and an add input respectively. A 5-bit addition is performed with symbols A1 and B2 as LSB. The circuit shown in FIG. 8 is constructed such that when the absolute value of the result of addition of two 5-bit data exceeds 7, one is added to the LSB to thereby close or end the result of addition at the bit strings shown in Table 1.

Thus, phase shift control over a non-continuous portion between the lag phase (13 in FIG. 3) and the lead phase (−14 in FIG. 3) with respect to the DDRS signal can be normally performed.

Further, the output of the delay latch 24a is also inputted to the frequency error compensator 27. The frequency error compensator 27 detects a frequency error included in a received signal from a variation in phase and outputs corrected data so as to cause the DDRS signal to follow the frequency of the received.

The frequency error corresponds to an offset produced between the frequency of the received signal and a transmit frequency of a base station due to a drift produced in the reference oscillator 11 and leads to degradation in demodulation characteristics. The frequency error can be obtained by determining errors from ideal symbols of a received phase, for example, and by detecting the average of the errors. The corrected data is added to the adder 26a so as to control the phase of the DDRS signal.

Thus, the adders 26a and 26b and the phase-lag detector 23 need to devise their structures. However, 12.6 MHz of the reference oscillator 11 can be shared for an operating clock of the detector 2 by using the phase detection on a 28-division basis.

A transmission system of the present embodiment will next be described. First of all, transmit data inputted from the transmit data input terminal 30 shown in FIG. 1 is inputted to the IQ generator 3. The IQ generator 3 outputs modulation vector signals in a base band for every input of 2 bits in accordance with the aforementioned coding rule.

For example, the transmission system may be constructed so as to implement a root Nyquist filter by digital arithmetic processing and obtain vector signals capable of realizing a desired modulation accuracy based on a D/A converted output. In this case, the oversampling points per symbol and the bit accuracy of the D/A converter need optimization to reduce power consumption and the size or scale of the circuit.

The operating clock employed in the circuit needs an integral multiple of a modulation rate (21 kHz), whereas the output generated from the reference oscillator 11 meets this condition (12.6 MHz=21 kHz×600).

Figure 9:
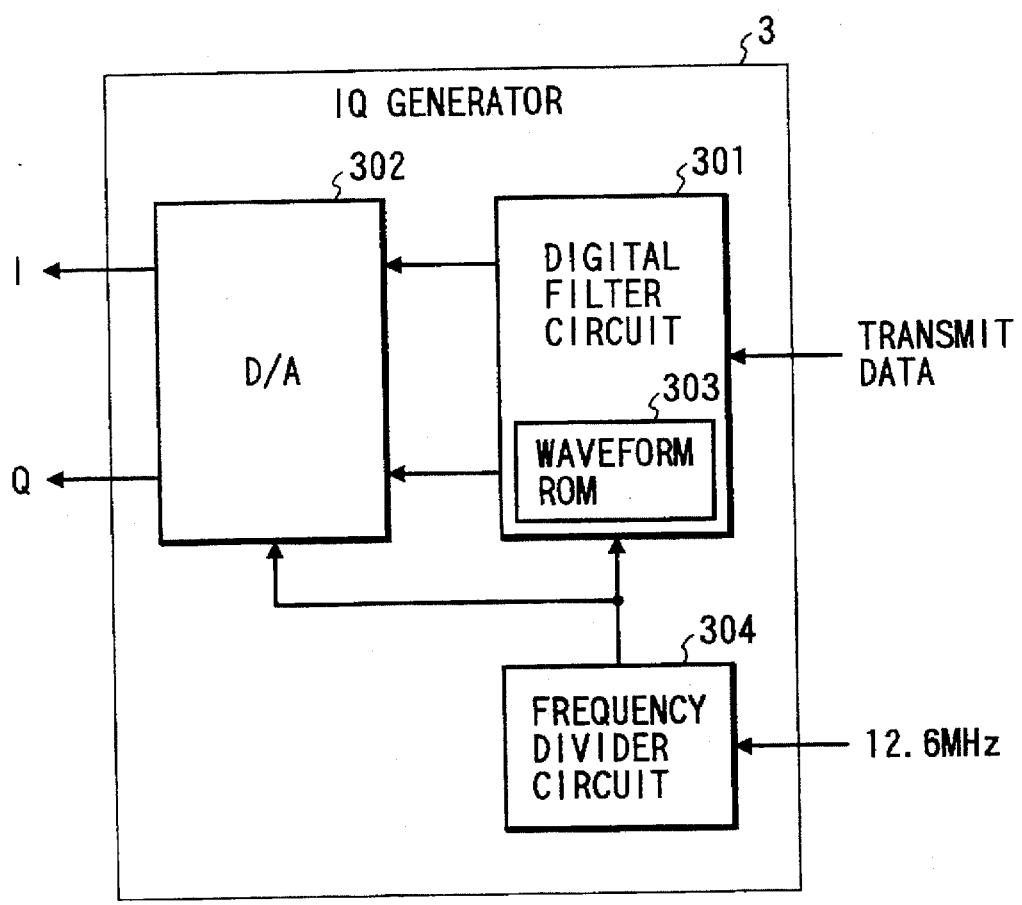
FIG. 9 is a block diagram showing an internal configuration of the IQ generator 3.

FIG. 9 is a block diagram showing an internal configuration of the IQ generator 3. In FIG. 9, it is seen that the generator includes a digital filter circuit 301, a DA converter 302, a waveform ROM 303 and a frequency dividing circuit 304.

When the digital filter circuit 301 receives transmit data therein, it performs a phase-space mapping in accordance with the coding rule based on the $\pi/4$ shifted QPSK modulation. The digital filter circuit 301 is provided with the waveform ROM 303 which stores therein waveforms of modulated signals, based on an impulse response of a root roll-off filter. Further, the digital filter circuit 301 generates address data for the waveform ROM 303 based on the above mapping processing and outputs modulated-signal waveform data therefrom. Thereafter, the DA converter 302 converts the waveform data into an analog signal and outputs I and Q signals therefrom.

Since the oversampling points of the waveform data exerts an influence on transmit spurious characteristics, a suitable value is selected by the system. Now, consider that 10 samples are taken per symbol. In this case, a read clock needs 210 kHz or higher and is supplied from the frequency dividing circuit 304 supplied with 12.6 MHz.

The vector signals outputted from the IQ generator 3 are inputted to the RF vector signal modulator 4. The RF vector signal modulator 4 modulates a transmit frequency signal outputted from the frequency synthesizer 12 based on the vector signals so as to output a transmit signal. The transmit signal is radiated from the antenna 7 through the power amplifier 5 and the duplexer 6.

According to the present embodiment, as described above, the operating clock can be shared for the detector 2 and the IQ generator 3 by employing the necessary reference oscillator in a radio system for the digital cellular telecommunication system. Further, since an additional oscillator is unnecessary, the present embodiment can contribute to a size reduction in the terminal and a reduced cost.

Since the voltage-controlled oscillator 152 is activated in synchronism with the reference oscillator 11 and other oscillators do not exist, beat noise can be prevented from being produced by a plurality of oscillators.

According to the present invention, as has been described above, the number of fixed oscillators used for the detector can be reduced and hence its size can be reduced. Further, the generation of beat noise and the like, and mutual interference between a plurality of oscillators, can be reduced.

Having now fully described the invention, it will be apparent to those skilled in the art that many changes and modifications can be made without departing from the spirit or scope of the invention as set forth herein.

We claim:

1. A digital radiocommunication terminal for effecting information transmission using an N-phase-shift-keyed signal by N-symbols (where N: integer), comprising:

a reference frequency oscillator; frequency synthesize means for multiplying an oscillation output generated from said reference frequency oscillator by a predetermined number;

first frequency converting means for generating a first intermediate-frequency band signal from an output generated from said frequency synthesize means and a received N-phase-shift-keyed signal; first intermediate frequency filtering means for effecting a band restriction on an output produced from said first frequency converting means;

a local oscillator;

second frequency converting means for generating a second intermediate-frequency band signal from an output produced from said local oscillator and an output produced from said first intermediate frequency filtering means;

amplifying means for amplifying said second intermediate-frequency band signal; and detecting means for detecting a modulated phase angle from a signal outputted from said amplifying means;

the oscillation output frequency generated from said reference frequency oscillator means being held set to a common multiple of the N symbols and the second intermediate frequency.

2. The digital radiocommunication terminal as claimed in claim 1, wherein said detecting means has means for generating a differential detection reference signal obtained by time-delaying a phase angle of said received N-phase-shift-keyed signal and phase-lag detecting means for detecting a phase lag between said differential detection reference signal and said received N-phase-shift-keyed signal.

3. The digital radiocommunication terminal as claimed in claim 2, wherein said phase-lag detecting means includes means for generating a gate pulse corresponding to a phase lag between said differential detection reference signal and said received N-phase-shift-keyed signal and means for counting the width of the gate pulse based on the oscillation output of said reference frequency oscillator.

4. The digital radiocommunication terminal as claimed in claim 2, wherein the oscillation output frequency of said reference frequency oscillator and the second intermediate frequency are set as 12.6 MHz and 450 kHz, respectively, and said phase-lag detecting means operates to perform phase quantization with an accuracy equal to dividing one wavelength of 450 kHz into 28 equal parts.

5. The digital radiocommunication terminal as claimed in claim 1, wherein the oscillation output frequency of said reference frequency oscillator is further set to an integral multiple of a symbol transfer rate of the N-phase-shift-keyed signal.

6. The digital radiocommunication terminal as claimed in claim 5, further including:

waveform generating means for generating waveforms of vector signals corresponding to signals identical and orthogonal in phase to the N-phase-shift-keyed signal; and orthogonal modulating means for modulating a transmit frequency using the vector signals.

7. The digital radiocommunication terminal as claimed in claim 6, wherein said waveform generating means comprises:

digital filter means for implementing a filter operation for Nyquist transmission by digital arithmetic processing and for generating quantized waveform data of a filter output; and digital-to-analog converting means for converting the quantized waveform data into an analog signal waveform and outputting the converted waveform therefrom.

8. The digital radiocommunication terminal as claimed in claim 7, wherein an oversampling clock signal per symbol of the waveform data is obtained by frequency-dividing the oscillation output produced from said reference frequency oscillator means.

9. The digital radiocommunication terminal as claimed in claim 1, wherein the oscillation output of said frequency synthesize means is set so as to become higher than the frequency of the received N-phase-shift-keyed signal and the output frequency of said local oscillator is set so as to become lower than the output frequency of said first intermediate-frequency filtering means.

10. A digital radiocommunication device for converting N-phase-shift-keyed received signal in respective conversions into first and second intermediate frequencies and for detecting a modulated phase angle from the result of the second intermediate frequency conversion, comprising:

reference frequency oscillation means having an oscillation frequency corresponding to a common multiple of the N phase and the second intermediate frequency;

means for effecting the first intermediate-frequency conversion based on a frequency signal obtained by multiplying the oscillation frequency signal produced from said reference frequency oscillation means by a number; and means for detecting said modulated phase angle with the oscillation frequency signal produced from said reference frequency oscillation means as a reference signal.

11. The digital radiocommunication device as claimed in claim 10, wherein the frequency of the oscillation frequency signal generated from said reference frequency oscillating means is an integral multiple of a symbol transfer rate of the N-phase-shift-keyed signal, and further including vector signal generating means for generating vector signals corresponding to signals identical and orthogonal in phase to the N-phase-shift-keyed signal with a frequency signal obtained by frequency-dividing the oscillation frequency signal produced from said reference frequency oscillation means as a reference signal.

* * * * *